US011879184B2

(12) United States Patent
Mori et al.

(10) Patent No.: US 11,879,184 B2
(45) Date of Patent: Jan. 23, 2024

(54) MANUFACTURING APPARATUS FOR A GROUP-III NITRIDE CRYSTAL COMPRISING A RAW MATERIAL CHAMBER AND A NURTURING CHAMBER IN WHICH A GROUP III-ELEMENT OXIDE GAS AND A NITROGEN ELEMENT-CONTAINING GAS REACT TO PRODUCE A GROUP-III NITRIDE CRYSTAL ON A SEED SUBSTRATE

(71) Applicant: Panasonic Holdings Corporation, Osaka (JP)

(72) Inventors: Yusuke Mori, Osaka (JP); Masashi Yoshimura, Osaka (JP); Masayuki Imanishi, Osaka (JP); Shigeyoshi Usami, Osaka (JP); Junichi Takino, Osaka (JP); Masayuki Hoteida, Osaka (JP); Shunichi Matsuno, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 34 days.

(21) Appl. No.: 17/848,927

(22) Filed: Jun. 24, 2022

(65) Prior Publication Data
US 2022/0411962 A1    Dec. 29, 2022

(30) Foreign Application Priority Data

Jun. 28, 2021   (JP) .................... 2021-106915

(51) Int. Cl.
*C30B 35/00* (2006.01)
*C30B 25/16* (2006.01)
(Continued)

(52) U.S. Cl.
CPC .......... *C30B 25/165* (2013.01); *C23C 16/303* (2013.01); *C23C 16/45561* (2013.01);
(Continued)

(58) Field of Classification Search
CPC ......... C30B 25/00; C30B 25/02; C30B 25/14; C30B 25/16; C30B 25/165; C30B 29/00;
(Continued)

(56) References Cited

U.S. PATENT DOCUMENTS

2016/0268129 A1    9/2016  Mori et al.

FOREIGN PATENT DOCUMENTS

EP          3 951 024          2/2022
JP      2017178772 A    *  10/2017
(Continued)

*Primary Examiner* — Kenneth A Bratland, Jr.
(74) *Attorney, Agent, or Firm* — Wenderoth, Lind & Ponack, L.L.P.

(57) ABSTRACT

A manufacturing apparatus for a group-III nitride crystal, the manufacturing apparatus includes: a raw material chamber that produces therein a group-III element oxide gas; and a nurturing chamber in which a group-III element oxide gas supplied from the raw material chamber and a nitrogen element-containing gas react therein to produce a group-III nitride crystal on a seed substrate, wherein an angle that is formed by a direction along a shortest distance between a forward end of a group-III element oxide gas supply inlet to supply the group-III element oxide gas into the nurturing chamber and an outer circumference of the seed substrate placed in the nurturing chamber, and a surface of the seed substrate is denoted by "θ", wherein a diameter of the group-Ill element oxide gas supply inlet is denoted by "S", wherein a distance between a surface, on which the seed substrate is placed, of a substrate susceptor that holds the seed substrate and a forward end of a first carrier gas supply inlet to supply a first carrier gas into the nurturing chamber is denoted by "$L_1$", wherein a distance between the forward end of the first carrier gas supply inlet and the forward end of the group-III element oxide gas supply inlet is denoted by "$M_1$", wherein a diameter of the seed substrate is denoted by (Continued)

"k", and wherein following Eqs. (1) to (4), $0°<\theta<90°$ (1), $0.21 \leq S/k \leq 0.35$ (2), $1.17 \leq (L_1+M_1)/k \leq 1.55$ (3), $k=2*(L_1+M_1)/\tan\theta+S$ (4) are satisfied.

5 Claims, 5 Drawing Sheets

(51) Int. Cl.
  *C30B 29/40* (2006.01)
  *C23C 16/455* (2006.01)
  *C23C 16/30* (2006.01)
  *C30B 25/14* (2006.01)
(52) U.S. Cl.
  CPC ............ *C30B 25/14* (2013.01); *C30B 29/406* (2013.01); *C30B 35/00* (2013.01)

(58) Field of Classification Search
  CPC ....... C30B 29/10; C30B 29/40; C30B 29/403; C30B 29/406; C30B 35/00; C23C 16/30; C23C 16/301; C23C 16/303; C23C 16/455; C23C 16/45561; C23C 16/45563; C23C 16/45574
  USPC .... 117/84, 88, 102, 104, 200, 204, 937, 952
  See application file for complete search history.

(56) References Cited

FOREIGN PATENT DOCUMENTS

| | | | |
|---|---|---|---|
| JP | 2020-164337 | | 10/2020 |
| JP | 2021-31336 | | 3/2021 |
| JP | 2021031336 A | * | 3/2021 |
| WO | 2015/053341 | | 4/2015 |

* cited by examiner

MANUFACTURING APPARATUS FOR A GROUP-III NITRIDE CRYSTAL COMPRISING A RAW MATERIAL CHAMBER AND A NURTURING CHAMBER IN WHICH A GROUP III-ELEMENT OXIDE GAS AND A NITROGEN ELEMENT-CONTAINING GAS REACT TO PRODUCE A GROUP-III NITRIDE CRYSTAL ON A SEED SUBSTRATE

CROSS-REFERENCE TO RELATED APPLICATIONS

This application claims a priority of Japanese Patent Application No. 2021-106915 filed on Jun. 28, 2021, the contents of which is incorporated herein by reference.

BACKGROUND

Technical Field

The present disclosure relates to a manufacturing apparatus for a group-Ill nitride crystal and a manufacturing method for a group-III nitride crystal.

Description of the Related Art

Group-III nitride crystals of GaN and the like are expected to be applied to the next-generation optical devices such as a high-power light emitting diode (LED) and a laser diode (LD), and to the next-generation electronic devices such as a high-power transistor to be mounted on an electric vehicle (EV), a plug-in hybrid vehicle (PHV), or the like. An oxide vapor phase epitaxy (OVPE) method that uses a group-III oxide as a raw material is used as a manufacturing method for a group-III nitride crystal (see, e.g., PCT International Publication No. 2015/053341).

An example of the reaction system in the OVPE method is as follows.
(1) Ga is heated and, in this state, an $H_2O$ gas is introduced. The introduced $H_2O$ gas reacts with Ga to produce a $Ga_2O$ gas (Formula (I) as below).
(2) An $NH_3$ gas is introduced and is reacted with the produced $Ga_2O$ gas to produce a GaN crystal on a seed substrate (Formula (II) as below).

$$2Ga(l)+H_2O(g) \rightarrow Ga_2O(g)+H_2(g) \quad (I)$$

$$Ga_2O(g)+2NH_3(g) \rightarrow 2GaN(s)+H_2O(g)+2H_2(g) \quad (II)$$

With the manufacturing method described in the above '341 publication, a problem however arises that, when the group-III nitride crystal is grown, an in-plane distribution occurs in the growth rate of the growing crystal on the seed substrate. With the in-plane distribution occurring in the growth rate, when a wafer is cut out from the grown crystal, regions each unable to be used as wafers are generated and this may result in a material loss.

SUMMARY

The present disclosure was conceived in view of the situations, and it is therefore one non-limiting and exemplary embodiment provides a manufacturing method for a group-III nitride crystal having high quality and a small film thickness distribution as a grown crystal, by reducing the in-plane distribution of the growth rate of the group-III nitride crystal.

In one general aspect, the techniques disclosed here feature: a manufacturing apparatus for a group-III nitride crystal of the present disclosure includes a raw material chamber and a nurturing chamber. The raw material chamber produces therein a group-III element oxide gas. The group-III element oxide gas supplied from the raw material chamber and a nitrogen element-containing gas react in the nurturing chamber to produce a group-III nitride crystal on a seed substrate. An angle formed by the direction along the shortest distance between a forward end of a group-III element oxide gas supply inlet to supply the group-III element oxide gas into the nurturing chamber and the outer circumference of a seed substrate placed in the nurturing chamber, and the surface of the seed substrate is denoted by "θ". The diameter of the group-III element oxide gas supply inlet is denoted by "S". A distance between the surface, on which the seed substrate is placed, of a substrate susceptor that holds the seed substrate, and a forward end of a first carrier gas supply inlet to supply a first carrier gas into the nurturing chamber is denoted by "$L_1$". A distance between the forward end of the first carrier gas supply inlet and the forward end of the group-III element oxide gas supply inlet is denoted by "$M_1$". The diameter of the seed substrate is denoted by "k". In this case, the following Eqs. (1) to (4) are satisfied.

$$0° < \theta < 90° \quad (1)$$

$$0.21 \leq S/k \leq 0.35 \quad (2)$$

$$1.17 \leq (L_1+M_1)/k \leq 1.55 \quad (3)$$

$$k = 2*(L_1+M_1)/\tan \theta + S \quad (4)$$

In another general aspect, the techniques disclosed here feature: a manufacturing method for a group-III nitride crystal uses the above manufacturing apparatus for a group-III nitride crystal. In the method, a flowrate of the group-III element oxide gas supplied from the group-III element oxide gas supply inlet is denoted by "A" (m/s), and a flowrate of the first carrier gas supplied from the first carrier gas supply inlet is denoted by "B" (m/s). In this case, following Eqs. (11) and (12), $$1.47 \text{ (m/s)} \leq A \leq 2.20 \text{ (m/s)} \quad (11)$$

$$0.50 \text{ (m/s)} \leq B \leq 0.70 \text{ (m/s)} \quad (12)$$

are satisfied.

According to the manufacturing apparatus for a group-III nitride crystal and the manufacturing method for a group-III nitride crystal of the present disclosure, a high-quality group-III nitride crystal whose film thickness distribution as a grown crystal is small can be manufactured by reducing the in-plane distribution of the growth rate of the group-III nitride crystal.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

<Progress to the Present Disclosure>

First, the circumstances leading to this disclosure will be described.

Figure 1:
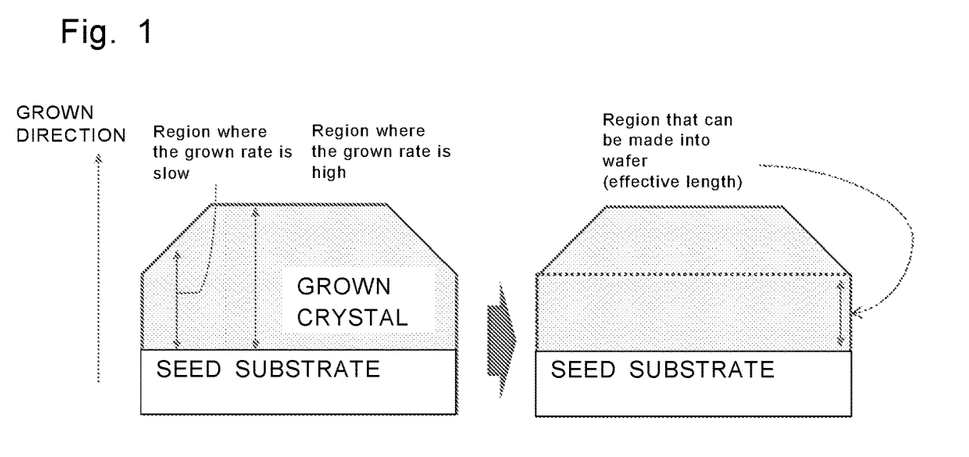
FIG. 1 is a conceptual cross-sectional diagram of cutting out wafers from a grown crystal.

FIG. 1 shows a conceptual cross-sectional view when cutting out a wafer from a grown crystal. When a group III nitride crystal is grown on a seed substrate, if an in-plane distribution occurs in the growth rate of the growth crystal on the seed substrate, the thickness of the growth crystal in the growth direction varies. In the region where the growth rate is slow, the thickness of the growth crystal is small, and in the region where the growth rate is high, the thickness of the growth crystal is larger than in the region where the growth rate is slow. When the thickness of the grown crystal varies in this way, when cutting out a wafer having a uniform film thickness from the grown crystal, it is necessary to cut out the wafer according to the portion having the smallest film thickness. As a result, a region that cannot be made into a wafer is generated, and material loss may occur.

Through diligent research, the present inventors have found that by reducing the in-plane distribution of the growth rate of Group III nitride crystals, it is possible to produce high-quality Group III nitride crystals with a small film thickness distribution of the growth crystals.

From the above, the apparatus for producing a group Ill nitride crystal and the method for producing a group Ill nitride crystal according to the present disclosure have been reached.

A manufacturing apparatus for a group-III nitride crystal according to a first aspect includes a raw material chamber that produces therein a group-III element oxide gas and a nurturing chamber in which the group-III element oxide gas supplied from the raw material chamber and a nitrogen element-containing gas reacts therein to produce a group-III nitride crystal on a seed substrate and, in the case where an angle formed by the direction along the shortest distance between a forward end of a group-III element oxide gas supply inlet to supply the group-III element oxide gas into the nurturing chamber and the outer circumference of the seed substrate placed in the nurturing chamber, and the surface of the seed substrate is denoted by "$\theta$", the diameter of the group-III element oxide gas supply inlet is denoted by "S", a distance between the surface, on which the seed substrate is placed, of a substrate susceptor that holds the seed substrate and a forward end of a first carrier gas supply inlet to supply a first carrier gas into the nurturing chamber is denoted by "$L_1$", a distance between the forward end of the first carrier gas supply inlet and the forward end of the group-III element oxide gas supply inlet is denoted by "$M_1$", and the diameter of the seed substrate is denoted by "k", satisfies the following Eqs. (1) to (4).

$$0° < \theta < 90° \tag{1}$$

$$0.21 \leq S/k \leq 0.35 \tag{2}$$

$$1.17 \leq (L_1+M_1)/k \leq 1.55 \tag{3}$$

$$k = 2*(L_1+M_1)/\tan\theta + S \tag{4}$$

In a manufacturing apparatus for a group-III nitride crystal according to a second aspect, the distance $M_1$ and the diameter k may further satisfy the following Eq. (5) in the first aspect.

$$0 < M_1/k \leq 0.267 \tag{5}$$

A manufacturing apparatus for a group-III nitride crystal according to a third aspect may, in the case where an angle formed by a perpendicular portion, that is perpendicular to the surface of the seed substrate, of a nitrogen element-containing gas supply inlet to supply the nitrogen element-containing gas into the nurturing chamber, and an inclined portion that is inclined from the perpendicular portion is denoted by "$\phi$" and an angle formed, in a cross-sectional view of the nurturing chamber, by a line connecting the center of the seed substrate and the forward end of the nitrogen element-containing gas supply inlet to each other, and the longitudinal direction of the nitrogen element-containing gas supply inlet is denoted by "$\gamma$", further satisfy the following Eqs. (6) and (7) in the above first or second aspect.

$$90° < \phi < 180° \tag{6}$$

$$15° \leq \gamma \leq 25° \tag{7}$$

A manufacturing apparatus for a group-III nitride crystal according to a fourth aspect further includes a second carrier gas supply inlet to supply a second carrier gas into the nurturing chamber and may, in the case where a distance between the surface, on which the seed substrate is placed, of the substrate susceptor and a forward end of the second carrier gas supply inlet is denoted by "$L_2$" and a distance between the forward end of the second carrier gas supply inlet and the forward end of the group-III element oxide gas supply inlet is denoted by "$M_2$", satisfy the following Eqs. (8) and (9) in any of the above first to third aspects.

$$1.17 \leq (L_2+M_2)/k \leq 1.55 \tag{8}$$

$$k = 2*(L_2+M_2)/\tan\theta + S \tag{9}$$

In a manufacturing apparatus for a group-III nitride crystal according to a fifth aspect, the distance $M_2$ and the diameter k may further satisfy the following Eq. (10) in the above fourth aspect.

$$0 < M_2/k \leq 0.267 \tag{10}$$

A manufacturing method for a group-III nitride crystal according to a sixth aspect is a manufacturing method for a group-III nitride crystal that uses the manufacturing apparatus for a group-III nitride crystal according to the above first or second aspect and, in the case where the flowrate of the group-III element oxide gas supplied from the group-III element oxide gas supply inlet is denoted by "A" (m/s) and the flowrate of a first carrier gas supplied from the first carrier gas supply inlet is denoted by "B" (m/s), satisfies the following Eqs. (11) and (12).

$$1.47 \text{ (m/s)} \leq A \leq 2.20 \text{ (m/s)} \quad (11)$$

$$0.50 \text{ (m/s)} \leq B \leq 0.70 \text{ (m/s)} \quad (12)$$

A manufacturing method for a group-III nitride crystal according to a seventh aspect is a manufacturing method for a group-III nitride crystal that uses the manufacturing apparatus for a group-III nitride crystal according to the third aspect and may, in the case where the flowrate of the group-III element oxide gas supplied from the group-III element oxide gas supply inlet is denoted by "A" (m/s), the flowrate of the first carrier gas supplied from the first carrier gas supply inlet is denoted by "B" (m/s), and the flowrate of the nitrogen element-containing gas supplied from the nitrogen element-containing gas supply inlet is denoted by "C" (m/s), satisfy the following Eqs. (13) to (15).

$$1.47 \text{ (m/s)} \leq A \leq 2.20 \text{ (m/s)} \quad (13)$$

$$0.50 \text{ (m/s)} \leq B \leq 0.70 \text{ (m/s)} \quad (14)$$

$$1.00 \text{ (m/s)} \leq C \leq 1.66 \text{ (m/s)} \quad (15)$$

A manufacturing method for a group-III nitride crystal according to an eighth aspect is a manufacturing method for a group-III nitride crystal that uses the manufacturing apparatus for a group-III nitride crystal according to the fourth or the fifth aspect and may, in the case where the flowrate of the group-III element oxide gas supplied from the group-III element oxide gas supply inlet is denoted by "A" (m/s), the flowrate of the first carrier gas supplied from the first carrier gas supply inlet is denoted by "B" (m/s), the flowrate of the nitrogen element-containing gas supplied from the nitrogen element-containing gas supply inlet is denoted by "C" (m/s), and the flowrate of the second carrier gas supplied from the second carrier gas supply inlet is denoted by "D" (m/s), satisfy the following Eqs. (16) to (19).

$$1.47 \text{ (m/s)} \leq A \leq 2.20 \text{ (m/s)} \quad (16)$$

$$0.50 \text{ (m/s)} \leq B \leq 0.70 \text{ (m/s)} \quad (17)$$

$$1.00 \text{ (m/s)} \leq C \leq 1.66 \text{ (m/s)} \quad (18)$$

$$0.15 \text{ (m/s)} \leq D \leq 0.25 \text{ (m/s)} \quad (19)$$

A manufacturing apparatus for a group-III nitride crystal and a manufacturing method for a group-III nitride crystal according to embodiments will be described below with reference to the accompanying drawings. In the drawings, members substantially identical to each other are denoted by same reference numerals.

First Embodiment

<Manufacturing Apparatus for a Group-III Nitride Crystal>

Figure 2:
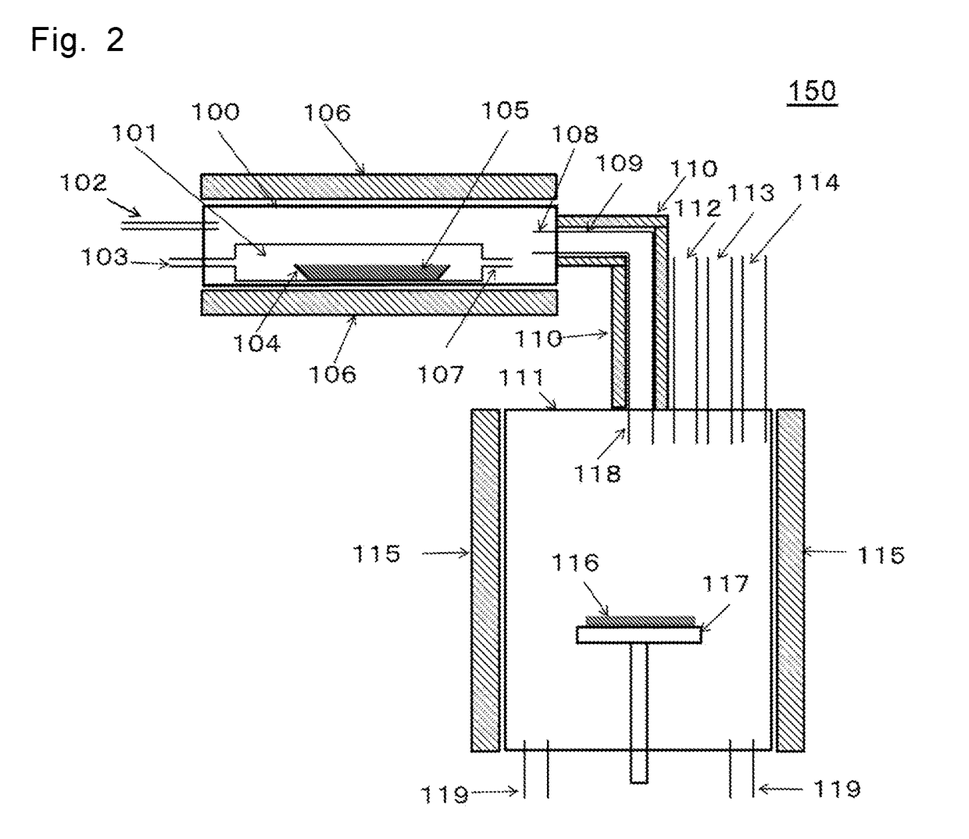
FIG. 2 is a schematic diagram of a manufacturing apparatus for a group-III nitride crystal according to a first embodiment of the present disclosure.

An overview of a manufacturing apparatus 150 for a group-III nitride crystal, that is used in a manufacturing method for a group-III nitride crystal, according to this first embodiment will first be described with reference to FIG. 2. In FIG. 2, the sizes, the proportions, and the like of the constituent members may be different from the actual ones.

The manufacturing apparatus 150 for a group-III nitride crystal according to the first embodiment includes a raw material chamber 100 and a nurturing chamber 111. The raw material chamber 100 produces therein a group-III element oxide gas. the group-III element oxide gas supplied from the raw material chamber 100 and a nitrogen element-containing gas react in the nurturing chamber 111 to produce a group-III nitride crystal on a seed substrate. An angle formed by the direction along the shortest distance between a forward end of a group-III element oxide gas supply inlet to supply the group-III element oxide gas into the nurturing chamber 100 and the outer circumference of the seed substrate placed in the nurturing chamber, and the surface of the seed substrate is denoted by "θ". The diameter of the group-III element oxide gas supply inlet is denoted by "S". A distance between the surface, on which the seed substrate is placed, of a substrate susceptor that holds the seed substrate and a forward end of a first carrier gas supply inlet to supply a first carrier gas into the nurturing chamber is denoted by "$L_1$". A distance between the forward end of the first carrier gas supply inlet and the forward end of the group-III element oxide gas supply inlet is denoted by "$M_1$". The diameter of the seed substrate is denoted by "k". In this case, the following Eqs. (1) to (4) are satisfied.

$$0° < \theta < 90° \quad (1)$$

$$0.21 \leq S/k \leq 0.35 \quad (2)$$

$$1.17 \leq (L_1 + M_1)/k \leq 1.55 \quad (3)$$

$$k = 2*(L_1 + M_1)/\tan \theta + S \quad (4)$$

According to this manufacturing apparatus 150 for a group-III nitride crystal, a high-quality group-III nitride crystal whose film thickness distribution as a grown crystal is small can be manufactured by reducing the in-plane distribution of the growth rate of the group-III nitride crystal.

Members constituting this manufacturing apparatus for a group-III nitride crystal will be described below.

A raw material reaction chamber 101 is disposed in the raw material chamber 100, and a raw material boat 104 on which a starting group-III element source 105 is mounted is disposed in the raw material reaction chamber 101. A reactive gas supply pipe 103 to supply a gas that reacts with the starting group-III element source 105 is connected to the raw material reaction chamber 101.

The raw material reaction chamber 101 includes a group-III element oxide gas discharge outlet 107 to discharge the produced group-III element oxide gas. In the case where the starting group-III element source 105 is an oxide, a reducing gas is used as the reactive gas. In the case where the starting group-III element source 105 is a metal, an oxidizing gas is used as the reactive gas.

A raw material carrier gas supply inlet 102 to supply the raw material carrier gas is connected to the raw material chamber 100, and the raw material carrier gas supplied from the raw material carrier gas supply inlet 102 and the group-III element oxide gas discharged from the group-III element oxide gas discharge outlet 107 flow from a gas discharge outlet 108 to the nurturing chamber 111 passing through a connecting pipe 109 and are supplied from a gas supply inlet (group-III element oxide gas supply inlet) 118 connected to the nurturing chamber 111, into the nurturing chamber 111.

The nurturing chamber 111 includes the gas supply inlet (hereinafter, also referred to as "group-III element oxide gas supply inlet") 118, a first carrier gas supply inlet 112, a nitrogen element-containing gas supply inlet 113, a second carrier gas supply inlet 114, and a gas discharge outlet 119. The nurturing chamber 111 includes a substrate susceptor 117 on which the seed substrate 116 is placed.

Figure 3:
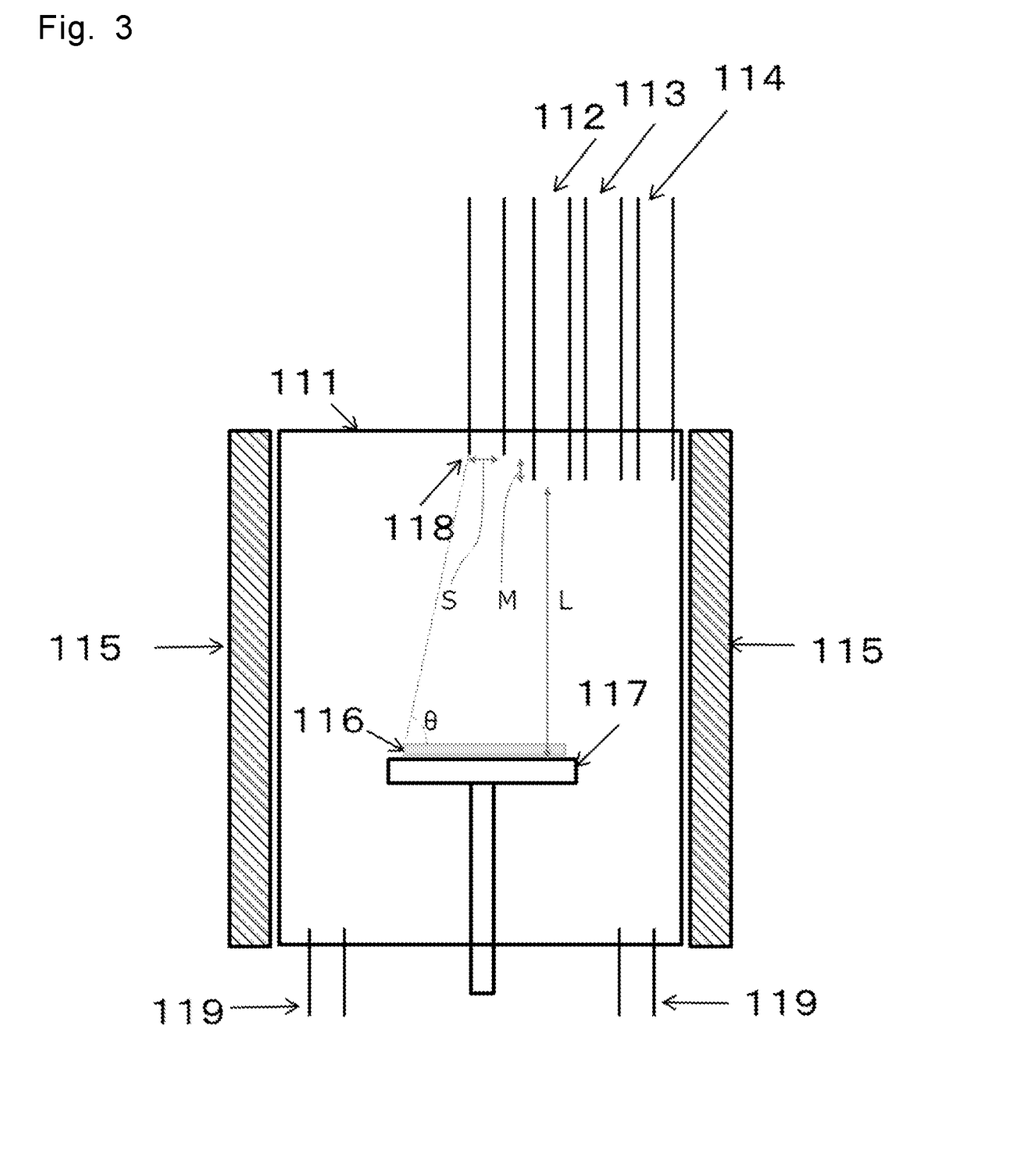
FIG. 3 is a schematic diagram of a nurturing chamber in the manufacturing apparatus for a group-III nitride crystal according to the first embodiment of the present disclosure.

In this manufacturing apparatus for a group-III nitride crystal of the present disclosure, parameters showed in FIG. 3 satisfy the following equations. Of the parameters showed in FIG. 3, "S" is the diameter of the group-III element oxide gas supply inlet 118, "$L_1$" is the distance between a forward end of the first carrier gas supply inlet 112 and the substrate susceptor 117, and "$M_1$" is the distance between the group-III element oxide gas supply inlet 118 and the first carrier gas supply inlet 112. At this time, the case where the group-III element oxide gas supply inlet 118 protrudes more to the side of the seed substrate 116 than the first carrier gas supply inlet does is defined as negative ($M_1<0$), the opposite case is defined as positive ($M_1>0$), and the case where these inlets are present in the same plane is defined as the origin ($M_1=0$). In the case where $M_1$ is $M_1 \leq 0$ and the group-III element oxide gas supply inlet 118 protrudes to the side of the seed substrate 116, the concentration of the nitrogen element-containing gas at the group-III element oxide gas supply inlet 118 becomes high at a group-Ill nitride crystal production step and a parasitic growth of a group-III nitride crystal may occur at the supply inlet 118. In the case where the degree of the parasitic growth is high, this may result in an occlusion of the group-III element oxide gas supply inlet 118 and a significant change of the gas flow, and a large-size group-III nitride crystal cannot therefore be stably grown. The diameter of each of the group-III element oxide gas supply inlet 118 and the seed substrate 116 placed on the substrate susceptor 117 is denoted by "k", and an angle formed by the direction along the shortest distance between the outer circumference of the seed substrate 116 and the forward end of the group-III element oxide gas supply inlet 118, and the surface of the seed substrate 116 is denoted by "θ". In this case, the parameters satisfy the following Eqs. (1) to (4)

$$0° < \theta < 90° \quad (1)$$

$$0.21 \leq S/k \leq 0.35 \quad (2)$$

$$1.17 \leq (L_1+M_1)/k \leq 1.55 \quad (3)$$

$$k = 2*(L_1+M_1)/\tan\theta + S \quad (4)$$

The reason for the above will be described below.

Rearrangement of Eq. (4) as to θ gives the following equation.

$$\tan\theta = 2*(L_1/k + M_1/k)/(1 - S/k) \quad (4')$$

From the viewpoint of uniforming the film thickness of the grown crystal and the viewpoint of stably increasing the size thereof, it is necessary for S/k, $M_1/k$, and $(L_1+M_1)/k$ to be in the ranges of $0.2 \leq S/k \leq 0.4$, $0 \leq M_1/k \leq 0.267$, and $1.075 \leq (L_1+M_1)/k \leq 1.33$. It is further necessary for tan θ to be tan $\theta > 0$ ($0° < \theta < 90°$). In this case, the relation of k an S is derived as $k>S$ from Eq. (4) or Eq. (4'). This means that the diameter S of the group-III element oxide gas supply inlet 118 is smaller than the diameter k of the seed substrate 116. Summarizing the above, the uniformity of the film thickness of the grown crystal can be secured by a certain degree in the case where Eqs. (1), (2), (3), (4), and (5) are satisfied based on the relation represented by Eq. (4').

$$0° < \theta < 90° \quad (1)$$

$$0.21 \leq S/k \leq 0.35 \quad (2)$$

$$1.17 \leq (L_1+M_1)/k \leq 1.55 \quad (3)$$

$$k = 2*(L_1+M_1)/\tan\theta + S \quad (4)$$

$$0 < M_1/k \leq 0.267 \quad (5)$$

Satisfying Eq. (5) is not essential and it is preferred that Eq. (5) be satisfied.

Figure 4A:
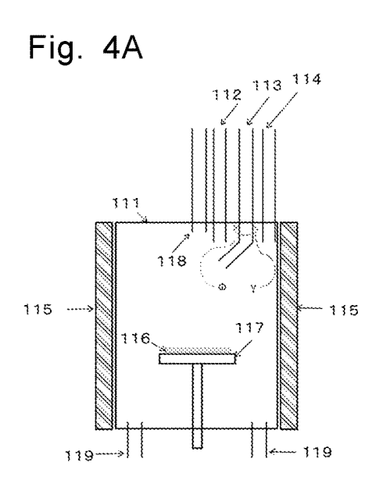
FIG. 4A is a schematic diagram of the nurturing chamber in the manufacturing apparatus for a group-III nitride crystal according to the first embodiment of the present disclosure.

It is preferred that the nitrogen element-containing gas supply inlet 113 be formed in a dogleg shape as showed in FIG. 4A. In this case, from the viewpoint pf preventing a disturbed flow occurring when the gases are mixed on the seed substrate 116, it is preferred that an angle (P formed by a perpendicular portion, that is perpendicular to the surface of the seed substrate 116, of the nitrogen element-containing gas supply inlet 113 to supply the nitrogen element-containing gas into the nurturing chamber 111 and an inclined portion that is inclined from the perpendicular portion, that is, the angle (1 of a portion bent in the dogleg shape satisfy Eq. (6).

$$90° < \varphi < 180° \quad (6)$$

Figure 4B:
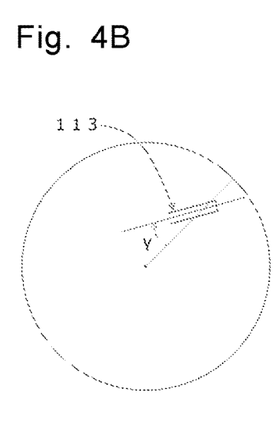
FIG. 4B is a schematic diagram of the nurturing chamber in the manufacturing apparatus for a group-III nitride crystal according to the first embodiment of the present disclosure.

From the viewpoint of promoting the diffusion of the group-III element oxide gas supplied from the group-III element oxide gas supply inlet 118 into the nurturing chamber 111, it is preferred that an angle "γ" formed, in the cross-sectional view showed in FIG. 4B, by a line connecting the center of the seed substrate 116 and the forward end of the nitrogen element-containing gas supply inlet 113 to each other and the longitudinal direction of the nitrogen element-containing gas supply inlet 113 satisfy Eq. (7).

$$15° \leq \gamma \leq 25° \quad (7)$$

In FIG. 4B, the angle γ is an angle defined clockwise from the line connecting the center of the seed substrate 116 and the forward end of the nitrogen element-containing gas supply inlet 113 to each other, and the definition thereof is not limited to this. The angle γ may be an angle defined counterclockwise from the line connecting the center of the seed substrate 116 and the forward end of the nitrogen element-containing gas supply inlet 113 to each other. In this case, when the clockwise rotation is defined to be positive and the counterclockwise rotation is defined to be negative, the angle γ may be as follows.

$$-25° \leq \gamma \leq -15° \quad (7\text{-}1)$$

A swirl flow can be formed and the diffusion of the group-III element oxide gas can be promoted by the fact that the longitudinal direction of the nitrogen element-containing gas supply inlet 113 is deflected by the angle γ from the line connecting the center of the seed substrate 116 and the forward end of the nitrogen element-containing gas supply inlet 113 to each other.

The longitudinal direction of the nitrogen element-containing gas supply inlet 113 may be deflected in the forward direction or the reverse direction of the rotation direction of the substrate susceptor 117. It is preferred that the rotation direction of the substrate susceptor 117 be set to be the same direction as the above deflection direction of the longitudinal direction of the nitrogen element-containing gas supply inlet 113 and the substrate susceptor 117 have a mechanism that can control rotations up to, for example, about 3,000 rpm.

It is preferred that the second carrier gas supply inlet 114 also satisfy the conditions that are equivalent to those for the first carrier gas supply inlet 112. In the case where such a distance between the surface, on which the seed substrate 116 is placed, of the substrate susceptor 117 and the forward end of the second carrier gas supply inlet 114 is denoted by "$L_2$" and a distance between the forward end of the second carrier gas supply inlet 114 and the forward end of the group-III element oxide gas supply inlet 118 is denoted by "$M_2$", it is preferred that the following Eqs. (8) and (9) be satisfied.

$$1.17 \leq (L_2+M_2)/k \leq 1.55 \tag{8}$$

$$k=2*(L_2+M_2)/\tan\theta+S \tag{9}$$

In addition, it is more preferred that the following Eq. (10) be satisfied.

$$0 < M_2/k \leq 0.267 \tag{10}$$

Figure 4C:
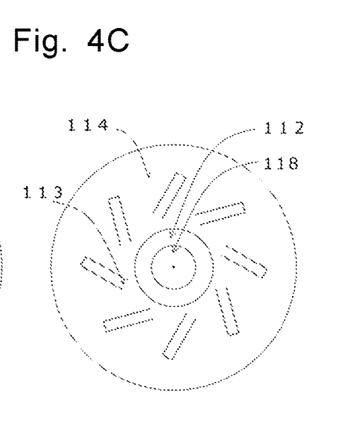
FIG. 4C is a schematic diagram of the nurturing chamber in the manufacturing apparatus for a group-III nitride crystal according to the first embodiment of the present disclosure.

It is further preferred that the supply inlets 118, 112, 113, and 114 for the gases to the nurturing chamber 111 be arranged in concentric circles in the cross-sectional view of the nurturing chamber 111 as showed in FIG. 4C. It is preferred that plural nitrogen element-containing gas supply inlets 113 be arranged in concentric circles in the cross-sectional view of the nurturing chamber 111 as showed in FIG. 4C, and it is also preferred that the plural nitrogen element-containing gas supply inlets 113 be configured to pass through the inside of the second carrier gas supply inlet 114.

Transformation of the above Eq. (4) into an equation representing $\tan\theta$ gives $\tan\theta = 2*(L_1+M_1)/(k-S) = (2*(L_1+M_1)/k)/(1-S/k)$ of the above Eq. (4').

Causing the above equation to represent the upper limit value and the lower limit value of $\tan\theta$ by substituting the upper limit value and the lower limit value of each of Eq. (2) and Eq. (3) in the above equation gives the following.

$$(2*1.17)/(1-0.21) \leq \tan\theta \leq (2*1.55)/(1-0.35)$$

Simplifying this gives the following.

$$2.96 \leq \tan\theta \leq 4.77$$

Because $\theta$ ranges from 0° to 90°, the range of 6 is as follows. $71.3° \leq \tan\theta \leq 78.2°$ The upper limit value and the lower limit value that satisfy Eq. (2), Eq. (3), and Eq. (4) are thereby acquired.

<Overview of Manufacturing Method>

Figure 5A:
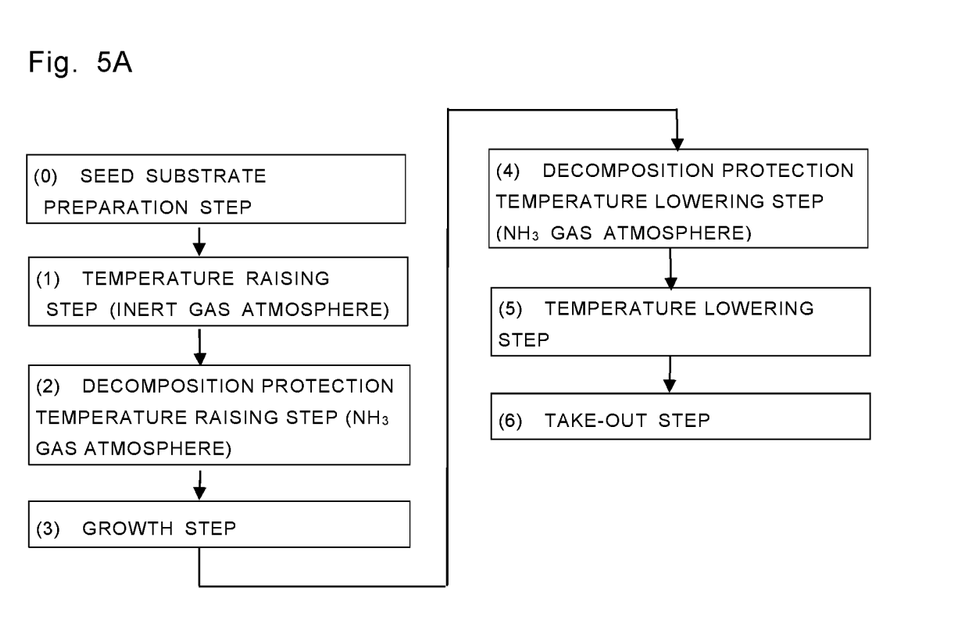
FIG. 5A is a flowchart showing a manufacturing method for a group-III nitride crystal according to the first embodiment of the present disclosure.
Figure 5B:
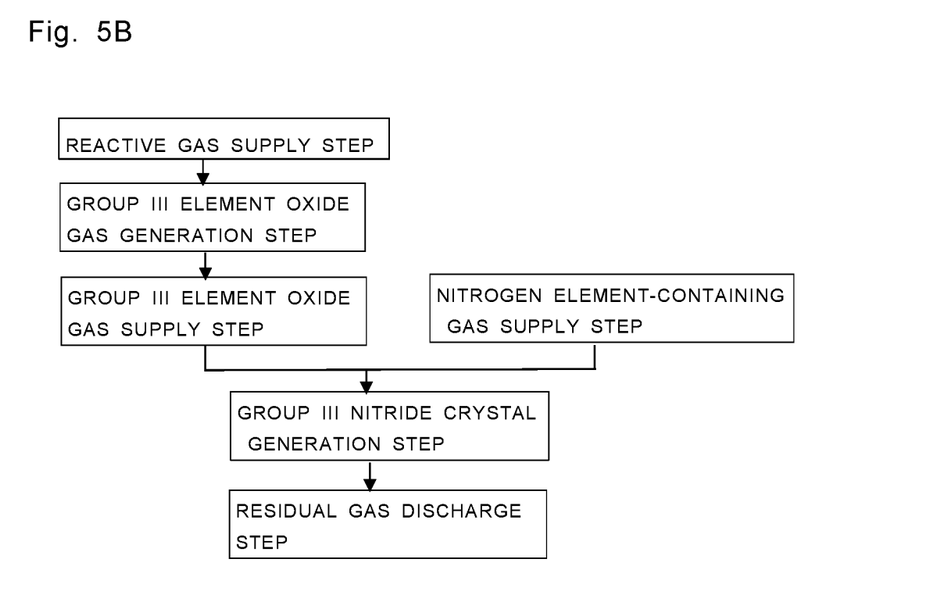
FIG. 5B is a flowchart showing a manufacturing method for a group-III nitride crystal according to the first embodiment of the present disclosure.

An overview of the manufacturing method for a group-III nitride crystal according to this first embodiment will be described with reference to a flowchart in FIGS. 5A and 5B and FIG. 2. FIG. 5A shows a time-series flowchart of the manufacturing method. FIG. 5B shows as steps the functional units from the upstream toward the downstream in the manufacturing apparatus used in this manufacturing method. The manufacturing method for a group-III nitride crystal includes a step of preparing the seed substrate 116, a step of increasing the temperature of the seed substrate 116 in an inert gas atmosphere, a step of increasing the temperature of the seed substrate 116 in a nitrogen element-containing gas atmosphere, a step of supplying the group-III element oxide gas and the nitrogen element-containing gas to grow a group-III nitride crystal on the seed substrate 116, a step of decreasing the temperature concurrently resolution-suppressing resolution of the group-III nitride crystal in the nitrogen element-containing gas atmosphere, a step of decreasing the temperature of the group-III nitride crystal in an inert gas atmosphere, and a step of taking out the group-III nitride crystal.

<Seed Substrate Preparation Step>

At a seed substrate preparation step of preparing the seed substrate 116, the seed substrate 116 is placed on the substrate susceptor 117.

<Temperature Increase Step>

In this first embodiment, the manufacturing method for a group-III nitride crystal includes a temperature increase step. At the temperature increase step, the temperature of the nurturing chamber 111 is increased to be 100° C. or higher and lower than 500° C. in an inert gas atmosphere.

<Resolution Protective Temperature Increase Step>

In this first embodiment, the manufacturing method for a group-III nitride crystal includes a resolution protective temperature increase step. At the resolution protective temperature increase step, the temperature of the nurturing chamber 111 is increased to be 500° C. or higher and lower than 1,000° C. in an $NH_3$ gas atmosphere.

<Growth Step>

At a growth step of growing a group-III nitride crystal on the seed substrate 116, the group-III element oxide gas is produced in the raw material chamber 100 and is supplied into the nurturing chamber 111 and the nitrogen element-containing gas is supplied into the nurturing chamber 111 to thereby execute production of a group-III nitride crystal on the seed substrate 116.

The growth step includes a reactive gas supply step, a group-III element oxide gas production step, a group-III element oxide gas supply step, a nitrogen element-containing gas supply step, a group-III nitride crystal production step, and a residual gas discharge step. The steps included in the growth step may concurrently be executed in the manufacturing apparatus for a group-III nitride crystal.

<Reactive Gas Supply Step>

At the reactive gas supply step, the reactive gas is supplied into the raw material reaction chamber 101.

<Group-III Element Oxide Gas Production Step>

At the group-III element oxide gas production step, the starting group-III element source and the reactive gas (that is a reducing gas in the case where the starting group-III element source is an oxide and that is an oxidizing gas in the case where the starting group-III element source is a metal) are reacted with each other to produce the group-III element oxide gas.

<Group-III Element Oxide Gas Supply Step>

At the group-III element oxide gas supply step, the group-III element oxide gas manufactured at the group-III element oxide gas production step is supplied into the nurturing chamber 111.

<Nitrogen Element-Containing Gas Supply Step>

At the nitrogen element-containing gas supply step, the nitrogen element-containing gas is supplied into the nurturing chamber 111.

<Group-III Nitride Crystal Production Step>

At the group-III nitride crystal production step, the group-III element oxide gas supplied into the nurturing chamber 111 at the group-III element oxide gas supply step and the nitrogen element-containing gas supplied into the nurturing chamber 111 at the nitrogen element-containing gas supply step are reacted with each other to grow a group-III nitride crystal on the seed substrate 116.

At this time, to uniform the in-plane growth rate distribution, it is desirable that the flowrate A (m/s) of the gas supplied from the group-III element oxide gas supply inlet 118, the flowrate B (m/s) of the gas supplied from the first carrier gas supply inlet 112, the flowrate C (m/s) of the gas supplied from the nitrogen element-containing gas supply inlet 113, and the flowrate D (m/s) of the gas supplied from the second carrier gas supply inlet 114 satisfy the following Eqs. (11) to (14).

$$1.47 \text{ (m/s)} \leq A \leq 2.20 \text{ (m/s)} \tag{11}$$

$$0.50 \text{ (m/s)} \leq B \leq 0.70 \text{ (m/s)} \tag{12}$$

$$1.00 \text{ (m/s)} \leq C \leq 1.66 \text{ (m/s)} \tag{13}$$

$$0.15 \text{ (m/s)} \leq D \leq 0.25 \text{ (m/s)} \tag{14}$$

<Residual Gas Discharge Step>

At the residual gas discharge step, unreacted gases that do not contribute to the production of the group-III nitride crystal are discharged to the exterior of the chamber.

<Resolution Protective Temperature Decrease Step>

In this first embodiment, the manufacturing method for a group-III nitride crystal includes a resolution protective temperature decrease step. At the resolution protective temperature decrease step, to suppress resolution of the group-III nitride crystal grown on the seed substrate 116, the temperature of each of the raw material chamber 100 and the nurturing chamber 111 is decreased to 500° C. concurrently supplying an $NH_3$ gas.

<Temperature Decrease Step>

In this first embodiment, the manufacturing method for a group-III nitride crystal includes a temperature decrease step. At the temperature decrease step, the temperature of each of the raw material chamber 100 and the nurturing chamber 111 is decreased to be lower than 100° C. in an inert gas atmosphere.

<Taking Out Step>

In this first embodiment, the manufacturing method for a group-III nitride crystal includes a taking out step. At the taking out step, the seed substrate 116 having the group-III nitride crystal grown thereon is taken out from the nurturing chamber 111.

<Details of Manufacturing Apparatus and Manufacturing Method>

The manufacturing method for a group-III nitride crystal according to this first embodiment will be described in detail with reference to FIG. 1 and FIG. 2.

In this first embodiment, metallic Ga is used as the starting group-III element source 105 and the starting group-III element source 105 is however not limited to this. For example, Al or In may also be used.

<Seed Substrate Preparation Step>

The seed substrate 116 is first prepared. For example, gallium nitride, gallium arsenide, silicon, sapphire, silicon carbide, zinc oxide, gallium oxide, and $ScAlMgO_4$ are each usable as the seed substrate 116. In this embodiment, gallium nitride is used as the seed substrate 116.

<Temperature Increase Step>

At the temperature increase step, the temperature of the nurturing chamber is increased in an inert gas atmosphere to a temperature at which no resolution of the seed substrate 116 occurs. In the manufacture of a group-III nitride crystal using the OVPE method, heating is executed for the temperature to be about 500° C. in an inert gas (such as, for example, an $N_2$ gas) atmosphere.

<Resolution Protective Temperature Increase Step>

At the resolution protective temperature increase step, the temperature is increased in the nitrogen element-containing gas atmosphere concurrently suppressing resolution of the seed substrate 116. In the manufacture of a group-III nitride crystal using the OVPE method, heating is executed until the temperature becomes 500° C. or higher and lower than 1,200° C. in the state where an inert gas and the nitrogen element-containing gas (an $NH_3$ gas) are mixed with each other. The reason why the $NH_3$ gas is mixed is to prevent the seed substrate 116 from being resolved by desorption of N atoms.

<Growth Step>

At the growth step, the group-III element oxide gas is produced in the raw material chamber 100 and is supplied into the nurturing chamber 111 and the nitrogen element-containing gas is supplied into the nurturing chamber 111 to thereby execute production of a group-III nitride crystal on the seed substrate 116. For example, the growth step includes the reactive gas supply step, the group-III element oxide gas production step, the group-III element oxide gas supply step, the nitrogen element-containing gas supply step, the group-III nitride crystal production step, and the residual gas discharge step.

<Reactive Gas Supply Step>

At the reactive gas supply step, the reactive gas is supplied from the reactive gas supply pipe 103 into the raw material reaction chamber 101 in the raw material chamber 100. As above, a reducing gas or an oxidizing gas is usable as necessary as the reactive gas. In this embodiment, because metallic Ga is used as the starting group-III element source 105, an $H_2O$ gas is used as the reactive gas.

<Group-III Element Oxide Gas Production Step>

At the group-III element oxide gas production step, the reactive gas supplied into the raw material reaction chamber 101 at the reactive gas supply step reacts with Ga that is the starting group-III element source 105 to produce a $Ga_2O$ gas that is the group-III element oxide gas. The produced $Ga_2O$ gas is discharged from the raw material reaction chamber 101 to the raw material chamber 100 through the group-III element oxide gas discharge outlet 107. The discharged $Ga_2O$ gas is mixed with the raw material carrier gas supplied from the first carrier gas supply inlet 102 to the raw material chamber and is supplied to the gas discharge outlet 108.

In this embodiment, the raw material chamber 100 is heated by a first heater 106. In the case where the raw material chamber 100 is heated, from the viewpoint of the boiling point of the $Ga_2O$ gas, it is preferred that the temperature of the raw material chamber 100 be 800° C. or higher. It is preferred that the temperature of the raw material chamber 100 be lower than the temperature of the nurturing chamber 111. As described later, in the case where the nurturing chamber is heated by a second heater 115, it is preferred that the temperature of the raw material chamber 100 be, for example, lower than 1,800° C.

The starting group-III element source 105 is placed in the raw material boat 104 disposed in the raw material reaction chamber 101. It is preferred that the raw material boat 104 have a shape capable of setting a large contact area for the reactive gas and the starting group-III element source with each other. To prevent the starting group-III element source 105 and the reactive gas from passing through the raw material reaction chamber 101 without contacting each other, it is preferred that the raw material boat 104 have, for example, a multiple-stage tray shape.

Methods of producing the group-III element oxide gas are roughly classified into a method of reducing the starting group-III element source 105 and a method of oxidizing the starting group-III element source 105. For example, in the method of reducing, an oxide (such as, for example, $Ga_2O_3$) is used as the starting group-III element source 105 and a reducing gas (such as, for example, an $H_2$ gas, a CO gas, a $CH_4$ gas, a $C_2H_6$ gas, an $H_2S$ gas, or an $SO_2$ gas) is used as the reactive gas. On the other hand, in the method of oxidizing, a non-oxide (such as, for example, liquid Ga) is used as the starting group-III element source 105 and an oxidizing gas (such as for example, an $H_2O$ gas, an $O_2$ gas, a CO gas, a $CO_2$ gas, an NO gas, an $N_2O$ gas, or an $NO_2$ gas) is used as the reactive gas. In addition to a Ga source as the starting group-III element source 105, an In source and an Al source can each be employed as the starting group-III element. An inert gas, an $H_2$ gas, or the like is usable as the first carrier gas.

At the group-III element oxide gas supply step, the $Ga_2O$ gas produced at the group-III element oxide gas production step is supplied into the nurturing chamber 111 through the gas discharge outlet 108, the connecting pipe 109, and the gas supply inlet 118. When the temperature of the connecting pipe 109 connecting the raw material chamber 100 and the nurturing chamber 111 to each other becomes lower than the temperature of the raw material chamber 100, a reverse reaction of the reaction to produce the group-III element oxide gas occurs and the starting Ga source 105 precipitates in the connecting pipe 109. It is therefore preferred that the connecting pipe 109 be heated by a third heater 110 at a temperature that is higher than the temperature of the first heater 106 to prevent the temperature of the connecting pipe 109 from becoming lower than the temperature of the raw material chamber 100.

<Nitrogen Element-Containing Gas Supply Step>

At the nitrogen element-containing gas supply step, the nitrogen element-containing gas is supplied from the nitrogen element-containing gas supply inlet 113 into the nurturing chamber 111. Examples of the nitrogen element-containing gas include an $NH_3$ gas, an NO gas, an $NO_2$ gas, an $N_2O$ gas, an $N_2H_2$ gas, and an $N_2H_4$ gas.

<Group-III Nitride Crystal Production Step>

At the group-III nitride crystal production step, the raw material gases supplied into the nurturing chamber through the supply steps are reacted with each other to grow a group-III nitride crystal on the seed substrate 116. It is preferred that the nurturing chamber 111 be heated by the second heater 115 to reach a high temperature at which the group-III element oxide gas and the nitrogen element-containing gas react with each other. At this time, as to the temperature of the nurturing chamber 111, to avoid occurrence of the reverse reaction of the reaction to produce the group-III element oxide gas, it is preferred that the temperature of the nurturing chamber 111 be controlled to avoid becoming lower than the temperature of the raw material chamber 100. It is preferred that the temperature of the nurturing chamber 111 heated by the second heater 115 be 1,000° C. or higher and 1,800° C. or lower. For the reason of suppressing temperature fluctuation of the nurturing chamber 111 caused by the $Ga_2O$ gas produced in the raw material chamber 100 and the raw material carrier gas, it is desirable that the temperature of the second heater 115 and that of the third heater 110 be equal to each other.

The group-III element oxide gas supplied into the nurturing chamber 111 through the group-III element oxide gas supply step and the nitrogen element-containing gas supplied into the nurturing chamber 111 through the nitrogen element-containing gas supply step are mixed on the upstream side of the seed substrate 116 to thereby be able to grow a group-III nitride crystal on the seed substrate 116. An inert gas, an $H_2$ gas, and the like are each usable as the second carrier gas.

Such steps included in the growth step as the reactive gas supply step, the group-III element oxide gas production step, the group-III element oxide gas supply step, the nitrogen element-containing gas supply step, the group-III nitride crystal production step, and the residual gas discharge step may concurrently be executed.

<Residual Gas Discharge Step>

At the residual gas discharge step, portions of the group-III element oxide gas and the nitrogen element-containing gas that are unreacted, the raw material carrier gas, the second carrier gas, and the first carrier gas are discharged from the gas discharge outlet 119.

<Resolution Protective Temperature Decrease Step>

At the resolution protective temperature decrease step, the temperature is decreased concurrently suppressing resolution of the group-III nitride crystal in a nitrogen element-containing gas atmosphere. In the manufacture of the group-III nitride crystal using the OVPE method, cooling is executed to 500° C. or lower in the state where an inert gas and the nitrogen element-containing gas (the $NH_3$ gas) are mixed with each other.

<Temperature Decrease Step>

At the temperature decrease step, the temperature is decreased in an inert gas atmosphere to a temperature at which the group-III nitride crystal can be taken put from the nurturing chamber.

<Taking Out Step>

In this first embodiment, the seed substrate 116 having the group-III nitride crystal grown thereon is taken out from the nurturing chamber 111 after the temperature decrease step.

Overviews of Example and Comparative Examples

A group-III nitride crystal was grown using the manufacturing apparatus for a group-III nitride crystal showed in FIG. 2. In the above, GaN was grown as the group-III nitride crystal. Liquid Ga was used as the starting Ga source, and Ga was reacted with an $H_2O$ gas that was a reactive gas to use a $Ga_2O$ gas as the group-III element oxide gas. An $NH_3$ was used as the nitrogen element-containing gas, and a mixture of an $H_2$ gas and an $N_2$ gas was used as each of the raw material carrier gas, the second carrier gas, and the first carrier gas. A self-supporting GaN substrate was used as the seed substrate. The gases were supplied such that the flow-rates of the gases were in the ranges of Eqs. (11), (12), (13), and (14).

Example 1

The temperature of the nurturing chamber was set to be about 1,200° C. and the temperature of the raw material chamber was set to be about 1,100° C. as the growth conditions. In this example, k was set to be 150 mm, S was set to be 45 mm, $L_1$ and $L_2$ were each set to be 160 mm, and $M_1$ and $M_2$ were each set to be 40 mm. In this case, the ranges of Eqs. (2), (5), and (3) were applicable. θ that was in the range of Eq. (1), to establish the relation of Eq. (4') was 75.29°.

As the result of growing GaN, the in-plane average value p of the growth rate of GaN grown on the seed substrate was 62.8 μm/h, and the in-plane dispersion thereof in the case where a denoted the standard deviation, was 4.68% when the in-plane dispersion of the growth rate was represented by 3σ/μ. The parasitic growth of GaN to each of the group-III element oxide gas supply inlet and the carrier gas supply inlets was an extremely small amount.

Comparative Example 1

The temperature of the nurturing chamber was set to be about 1,200° C. and the temperature of the raw material chamber was set to be about 1,100° C. as the growth conditions. In this example, k was set to be 100 mm, S was set to be 30 mm, $L_1$ and $L_2$ were each set to be 160 mm, and $M_1$ and $M_2$ were each set to be 0 mm. In this case, the range of Eq. (6 VI) was applicable and resulted however in $M_1/k=0$, $M_2/k=0$, $(L_1+M_1)/k=1.60$, and $(L_2+M_2)/k=1.60$, and these were out of the ranges of Eqs. (5) and (3). θ that was in the range of Eq. (1), to establish the relation of Eq. (4') was 83.46°.

As the result of growing GaN, the in-plane average value μ of the growth rate of GaN grown on the seed substrate was 48.25 μm/h, and the in-plane dispersion of the growth rate was 37.40% by 3σ/μ. The parasitic growth of GaN to each of the group-III element oxide gas supply inlet and the carrier gas supply inlets was recognized in a large amount.

Comparative Example 2

The temperature of the nurturing chamber was set to be about 1,200° C. and the temperature of the raw material chamber was set to be about 1,100° C. as the growth conditions. In this example, k was set to be 100 mm, S was set to be 30 mm, $L_1$ and $L_2$ were each set to be 100 mm, and $M_1$ and $M_2$ were each set to be 0 mm. In this case, the range of Eq. (VI) was applicable and resulted however in $M_1/k=0$, $M_2/k=0$, $(L_1+M_1)/k=1.00$, and $(L_2+M_2)/k=1.00$, and these were out of the ranges of Eqs. (5) and (3). θ that was in the range of Eq. (1), to establish the relation of Eq. (4') was 79.61°.

As the result of growing GaN, the in-plane average value p of the growth rate of GaN grown on the seed substrate was 67.75 μm/h, and the in-plane dispersion of the growth rate was 58.19% by 3σ/μ. The parasitic growth of GaN to each of the group-III element oxide gas supply inlet and the carrier gas supply inlets was recognized in a large amount.

Comparative Example 3

The temperature of the nurturing chamber was set to be about 1,200° C. and the temperature of the raw material chamber was set to be about 1,100° C. as the growth conditions. In this example, k was set to be 150 mm, S was set to be 67 mm, $L_1$ and $L_2$ were each set to be 160 mm, and $M_1$ and $M_2$ were each set to be 0 mm. In this case, the range of Eq. (3) was applicable and resulted however in $S/k=0.4467$, $M_1/k=0$, and $M_2/k=0$, and these were out of the ranges of Eqs. (2) and (5). θ that was in the range of Eq. (1), to establish the relation of Eq. (4') was 75.46°.

As the result of growing GaN, the in-plane average value p of the growth rate of GaN grown on the seed substrate was 70.6 μm/h, and the in-plane dispersion of the growth rate was 76.18% by 3σ/μ. The parasitic growth of GaN to each of the group-III element oxide gas supply inlet and the carrier gas supply inlets was recognized in a large amount.

Comparative Example 4

The temperature of the nurturing chamber was set to be about 1,200° C. and the temperature of the raw material chamber was set to be about 1,100° C. as the growth conditions. In this example, k was set to be 150 mm, S was set to be 20 mm, $L_1$ and $L_2$ were each set to be 160 mm, and $M_1$ and $M_2$ were each set to be 0 mm. In this case, the range of Eq. (3) was applicable and resulted however in $S/k=0.1333$, $M_1/k=0$, and $M_2/k=0$, and these were out of the ranges of Eqs. (2) and (5). θ that was in the range of Eq. (1), to establish the relation of Eq. (4') was 67.890.

As the result of growing GaN, the in-plane average value p of the growth rate of GaN grown on the seed substrate was 80.0 μm/h, and the in-plane dispersion of the growth rate was 50.48% by 3σ/μ. The parasitic growth of GaN to each of the group-III element oxide gas supply inlet and the carrier gas supply inlets was recognized in a large amount.

Summary of Example and Comparative Examples

Figure 6A:
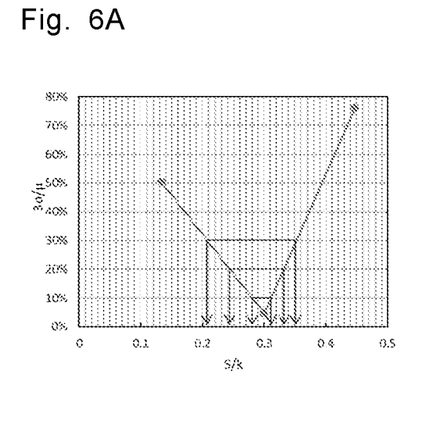
FIG. 6A is a graph showing the relation between S/k and $3\sigma/\mu$.
Figure 6B:
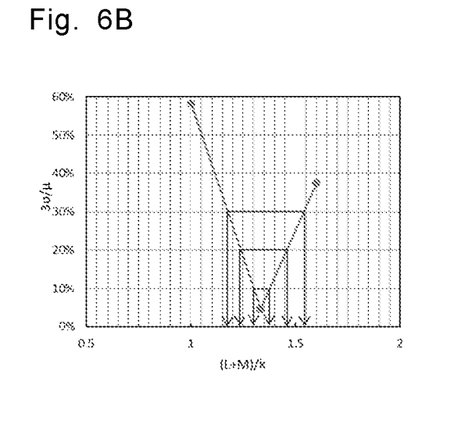
FIG. 6B is a graph showing the relation between $(L_1+M_1)/k$ and $3\sigma/\mu$.

Table 1 shows a list of the results of Example and Comparative Examples. In Example 1 that satisfied all of Eqs. (2), (5), and (3), the film thickness distribution was 4.68% by 3σ/μ, and extremely uniform growth was realized as bulk growth and GaN parasitic growth to the group-III element oxide gas supply inlet occurred in an extremely small amount. FIGS. 6A and 6B show the results of Example and Comparative Examples in graphs. As can be seen from the graphs, in the case where the in-plane dispersion 3σ/μ of the growth rate is set to be 30% or lower, it is necessary to set S/k to be 0.21 or greater and 0.35 or smaller, and (L+M)/k to be 1.17 or greater and 1.55 or smaller. To set 3σ/μ to be 20% or lower, it is necessary to set S/k to be 0.245 or greater and 0.33 or smaller and (L+M)/k to be 1.23 or greater and 1.45 or smaller. To set 3σ/μ to be 10% or lower, it is necessary to set S/k to be 0.28 or greater and 0.31 or smaller and (L+M)/k to be 1.30 or greater and 1.38 or smaller.

TABLE 1

|  | Example 1 | Comparative Example 1 | Comparative Example 2 | Comparative Example 3 | Comparative Example 4 |
|---|---|---|---|---|---|
| S/k | OK | OK | OK | Upper limit NG | Lower Limit NG |
| M/k | OK | Lower limit NG | Lower limit NG | Lower limit NG | Lower limit NG |
| (L + M)/k | OK | Upper limit NG | Lower limit NG | OK | OK |
| Average μ (μm/h) | 62.8 | 48.25 | 67.75 | 70.6 | 80 |
| 3σ/μ | 4.68% | 37.40% | 58.19% | 76.18% | 50.48% |
| Amount of Parasitic Growth | Extremely small | Large | Large | Large | Large |

From the above, a group=III nitride crystal having high quality and a uniform in-plane film thickness distribution as a grown crystal can be manufactured by satisfying the desired ranges according to the present disclosure.

Those each acquired by combining as necessary optional embodiment and/or Example of the above various embodiments and/or Examples are included in the present disclosure, and each achieve the effects that are achieved by the optional embodiment and/or Example.

100 raw material chamber
101 raw material reaction chamber
102 raw material carrier gas supply inlet
103 reactive gas supply pipe
104 raw material boat
105 starting Ga source
106 first heater
107 group-III element oxide gas discharge outlet
108 group-III element oxide gas and carrier gas discharge outlet
109 connecting pipe
110 third heater
111 nurturing chamber
112 first carrier gas supply inlet
113 nitrogen element-containing gas supply inlet
114 second carrier gas supply inlet
115 second heater
116 seed substrate
117 substrate susceptor
118 group-III element oxide gas supply inlet 119 gas discharge outlet
150 manufacturing apparatus for a group-III nitride crystal

What is claimed is:

1. A manufacturing apparatus for a group-III nitride crystal, the manufacturing apparatus comprising:
a raw material chamber that produces therein a group-III element oxide gas; and
a nurturing chamber in which a group-III element oxide gas supplied from the raw material chamber and a nitrogen element-containing gas react therein to produce a group-III nitride crystal on a seed substrate,
wherein an angle that is formed by a direction along a shortest distance between a forward end of a group-III element oxide gas supply inlet to supply the group-III element oxide gas into the nurturing chamber and an outer circumference of the seed substrate placed in the nurturing chamber, and a surface of the seed substrate is denoted by "θ", wherein
a diameter of the group-III element oxide gas supply inlet is denoted by "S", wherein
a distance between a surface, on which the seed substrate is placed, of a substrate susceptor that holds the seed substrate and a forward end of a first carrier gas supply inlet to supply a first carrier gas into the nurturing chamber is denoted by "$L_1$", wherein
a distance between the forward end of the first carrier gas supply inlet and the forward end of the group-III element oxide gas supply inlet is denoted by "$M_1$", wherein
a diameter of the seed substrate is denoted by "k", and wherein
following Eqs. (1) to (4), $$0° < \theta < 90° \tag{1}$$

$$0.21 \leq S/k \leq 0.35 \tag{2}$$

$$1.17 \leq (L_1 + M_1)/k \leq 1.55 \tag{3}$$

$$k = 2*(L_1 + M_1)/\tan\theta + S \tag{4}$$

are satisfied.

2. The manufacturing apparatus for a group-III nitride crystal according to claim 1, wherein
a following Eq. (5), $$0 < M_1/k \leq 0.267 \tag{5}$$

is further satisfied by the distance $M_1$ and the diameter k.

3. The manufacturing apparatus for a group-III nitride crystal according to claim 1, wherein
an angle that is formed by a perpendicular portion, that is perpendicular to the surface of the seed substrate, of a nitrogen element-containing gas supply inlet to supply the nitrogen element-containing gas into the nurturing chamber and an inclined portion that is inclined from the perpendicular portion is denoted by "φ", wherein
an angle that is formed, in a cross-sectional view of the nurturing chamber, by a line connecting a center of the seed substrate and the forward end of the nitrogen element-containing gas supply inlet to each other and a longitudinal direction of the nitrogen element-containing gas supply inlet is denoted by "γ", and wherein
following Eqs. (6) and (7), $$90° < \phi < 180° \tag{6}$$

$$15° \leq \gamma \leq 25° \tag{7}$$

are further satisfied.

4. The manufacturing apparatus for a group-III nitride crystal according to claim 1, further comprising
a second carrier gas supply inlet to supply a second carrier gas into the nurturing chamber, wherein
a distance between the surface, on which the seed substrate is placed, of the substrate susceptor and a forward end of the second carrier gas supply inlet is denoted by $L_2$, wherein
a distance between the forward end of the second carrier gas supply inlet and the forward end of the group-III element oxide gas supply inlet is denoted by $M_2$, and wherein
following Eqs. (8) and (9), $$1.17 \leq (L_2 + M_2)/k \leq 1.55 \tag{8}$$

$$k = 2*(L_2 + M_2)/\tan\theta + S \tag{9}$$

are satisfied.

5. The manufacturing apparatus for a group-III nitride crystal according to claim 4, wherein
a following Eq. (10), $$0 < M_2/k \leq 0.267 \tag{10}$$

is further satisfies by the distance $M_2$ and the diameter k.

* * * * *